US009653626B2

(12) United States Patent
Hasegawa et al.

(10) Patent No.: US 9,653,626 B2
(45) Date of Patent: May 16, 2017

(54) PHOTOELECTRIC CONVERSION DEVICE AND METHOD FOR PRODUCING PHOTOELECTRIC CONVERSION DEVICE

(71) Applicant: SANYO Electric Co., Ltd., Osaka (JP)

(72) Inventors: Isao Hasegawa, Hyogo (JP); Toshio Asaumi, Osaka (JP); Hitoshi Sakata, Osaka (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

(21) Appl. No.: 14/036,814

(22) Filed: Sep. 25, 2013

(65) Prior Publication Data

US 2014/0020757 A1    Jan. 23, 2014

Related U.S. Application Data

(63) Continuation of application No. PCT/JP2012/055440, filed on Mar. 2, 2012.

(30) Foreign Application Priority Data

Mar. 28, 2011 (JP) ................. 2011-069576
Mar. 28, 2011 (JP) ................. 2011-069669

(51) Int. Cl.
*H01L 31/0224* (2006.01)
*H01L 31/068* (2012.01)
(Continued)

(52) U.S. Cl.
CPC .. *H01L 31/022441* (2013.01); *H01L 31/0747* (2013.01); *H01L 31/1868* (2013.01); *H01L 31/0682* (2013.01); *Y02E 10/50* (2013.01)

(58) Field of Classification Search
CPC ............. H01L 31/0682; H01L 31/0747; H01L 31/1868
See application file for complete search history.

(56) References Cited

U.S. PATENT DOCUMENTS 4,633,033 A * 12/1986 Nath et al. ................. 136/256
4,782,376 A * 11/1988 Catalano ........... H01L 31/03762
136/258
(Continued)

FOREIGN PATENT DOCUMENTS

JP    2005101240 A    4/2005
JP    2008021993 A    1/2008
(Continued)

OTHER PUBLICATIONS

Machine translation of JP2011-035092A.*
(Continued)

*Primary Examiner* — Eric R Smith
(74) *Attorney, Agent, or Firm* — Cantor Colburn LLP (57) ABSTRACT

There is provided a photovoltaic device (100) having a substrate (10), i-type amorphous layers (16i, 18i) formed over a region of at least a part of a back surface of the substrate, and an i-type amorphous layer (12i) formed over a region of at least a part of a light-receiving surface of the substrate (10); and characterized in that electrodes (24n, 24p) are provided on the back surface and no electrode is provided on the light-receiving surface, and an electrical resistance per unit area of the back surface side i-type amorphous layers is lower than an electrical resistance per unit area of the light-receiving surface side i-type amorphous layer.

2 Claims, 5 Drawing Sheets (51) Int. Cl.
*H01L 31/0747* (2012.01)
*H01L 31/18* (2006.01)

(56) References Cited

U.S. PATENT DOCUMENTS

| | | | |
|---|---|---|---|
| 5,667,597 A * | 9/1997 | Ishihara | 136/258 |
| 5,705,828 A * | 1/1998 | Noguchi | H01L 31/0725 257/52 |
| 8,927,853 B2 | 1/2015 | Takahama et al. | |
| 2002/0069911 A1* | 6/2002 | Nakamura | H01L 31/0745 136/243 |
| 2005/0062041 A1* | 3/2005 | Terakawa | H01L 31/0747 257/53 |
| 2006/0130891 A1* | 6/2006 | Carlson | 136/256 |
| 2008/0000522 A1 | 1/2008 | Johnson et al. | |
| 2009/0056800 A1* | 3/2009 | Ulyashin | H01L 31/02167 136/256 |
| 2010/0059109 A1 | 3/2010 | Nakayashiki et al. | |
| 2010/0084009 A1* | 4/2010 | Carlson et al. | 136/255 |
| 2010/0087031 A1 | 4/2010 | Veschetti et al. | |
| 2011/0000532 A1 | 1/2011 | Niira et al. | |
| 2011/0056545 A1* | 3/2011 | Ji | H01L 31/02167 136/255 |
| 2011/0056550 A1* | 3/2011 | Choi | H01L 31/02167 136/256 |
| 2012/0012179 A1* | 1/2012 | Asaumi et al. | 136/256 |
| 2012/0090674 A1 | 4/2012 | Takahama et al. | |

FOREIGN PATENT DOCUMENTS

| | | |
|---|---|---|
| JP | 2008519438 A | 6/2008 |
| JP | 2009200267 A | 9/2009 |
| JP | 2010504636 A | 2/2010 |
| JP | 2010067972 A | 3/2010 |
| JP | 2010171263 A | 8/2010 |
| JP | 2010251343 A | 11/2010 |
| JP | 2011035092 A | 2/2011 |
| WO | 2009096539 A1 | 8/2009 |
| WO | 2010098445 A1 | 9/2010 |
| WO | WO 2010113750 A1 * | 10/2010 |

OTHER PUBLICATIONS

Japanese Office Action corresponding to Application No. 2013-507309; Date of Mailing: Dec. 2, 2014, no English abstract included.

Japanese Office Action corresponding to Application No. 2013-507309; Date of Mailing: Aug. 4, 2015.

Japanese Office Action corresponding to Application No. 2013-507309; Date of Mailing: Feb. 9, 2016.

* cited by examiner

PHOTOELECTRIC CONVERSION DEVICE AND METHOD FOR PRODUCING PHOTOELECTRIC CONVERSION DEVICE

CROSS-REFERENCE TO RELATED APPLICATION

The present application is a continuation under 35 U.S.C. §120 of PCT/JP2012/055440, filed Mar. 2, 2012, which is incorporated herein by reference and which claimed priority to Japanese Patent Application No. 2011-069576 filed Mar. 28, 2011 and Japanese Patent Application No. 2011-069669 filed Mar. 28, 2011. The present application likewise claims priority under 35 U.S.C. §119 to Japanese Patent Application No. 2011-069576 filed Mar. 28, 2011 and Japanese Patent Application No. 2011-069669 filed Mar. 28, 2011, the entire contents of both of which are also incorporated herein by reference.

TECHNICAL FIELD

The present invention relates to a back contact type photovoltaic device and to a method of producing the photovoltaic device.

BACKGROUND ART

In order to improve power generation efficiency of a solar power generation system or the like, various types of photovoltaic devices are considered. Patent Document 1 discloses a back contact type photovoltaic device in which a p-type semiconductor region and an n-type semiconductor region are formed on a side opposite the light-receiving surface (back surface side) of a semiconductor substrate.

In the back contact type photovoltaic device, because no electrode is provided on the light-receiving surface side and the electrode is provided only on the back surface side, an effective light-receiving area can be increased and the power generation efficiency can be improved. In addition, because the connection between photovoltaic cells can be achieved solely on the back surface side, a wide-width wiring member can be used. Therefore, a voltage drop and a power loss at the portion of the wiring member can be reduced.

RELATED ART REFERENCES

Patent Document

[Patent Document 1] JP 2009-200267 A

DISCLOSURE OF INVENTION

Technical Problem

In a back contact type photovoltaic device, the carriers generated by the photoelectric conversion in the semiconductor substrate must be efficiently collected at an electrode provided on the back surface.

In addition, in a photovoltaic device, the amount of light absorption is high at a semiconductor region near the light-receiving surface. Because this region near the light-receiving surface becomes the primary carrier generation section, it is necessary to inhibit recombination of the carriers at the carrier generation section in order to improve the photovoltaic efficiency.

Solution to Problem

According to one aspect of the present invention, there is provided a photovoltaic device comprising a substrate comprising a semiconductor material, a first passivation layer formed over a region of at least a part of a first surface of the substrate, and a second passivation layer formed over a region of at least a part of a second surface of the substrate opposite the first surface, wherein an electrode is provided on the first surface side, no electrode is provided on the second surface side, and an electrical resistance per unit area of the first passivation layer is lower than an electrical resistance per unit area of the second passivation layer.

According to another aspect of the present invention, there is provided a method of producing a photovoltaic device, comprising a first step in which a first passivation layer is formed over a region of at least apart of a first surface of a substrate comprising a semiconductor material, a second step in which, after the first step, a second passivation layer is formed over a region of at least apart of a second surface of the semiconductor substrate opposite the first surface, and a third step in which, after the second step, an electrode is formed only on the second surface side.

Advantageous Effects of Invention

According to various aspects of the present invention, a photovoltaic device can be provided in which the carriers generated by photoelectric conversion in the substrate can be efficiently collected by electrodes provided on the back surface.

Further, according to various aspects of the present invention, there can be provided a method for producing a photovoltaic device which enables inhibition of recombination of carriers near the light-receiving surface and which has an improved photovoltaic rate.

BEST MODE FOR CARRYING OUT THE INVENTION

First Preferred Embodiment

Figure 1:
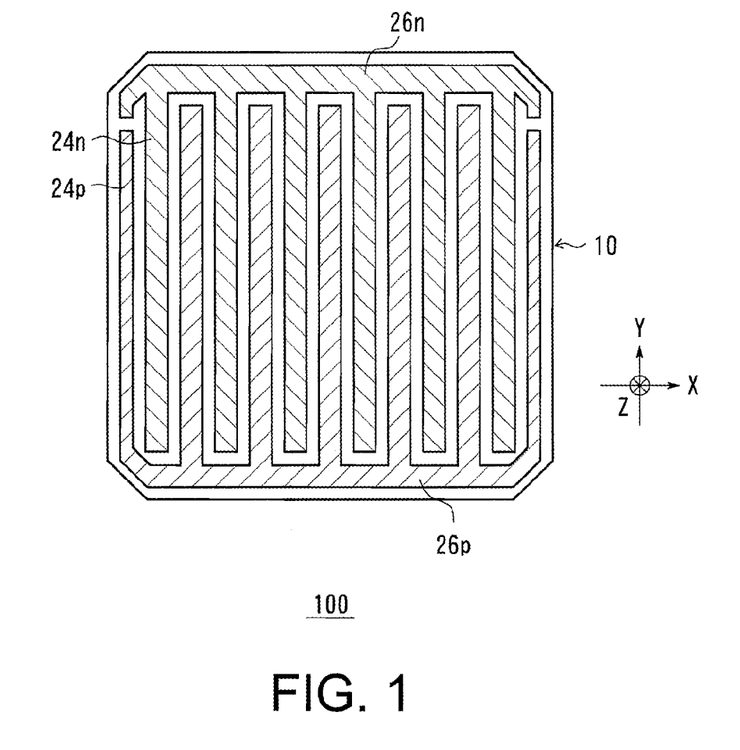
FIG. 1 is a back surface side plan view of a photovoltaic device according to a preferred embodiment of the present invention.
Figure 2:
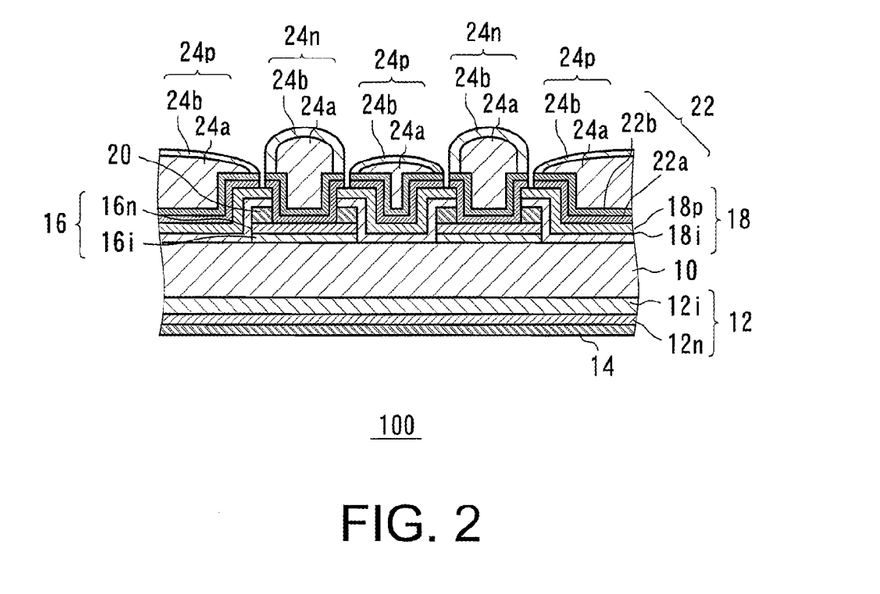
FIG. 2 is a cross sectional diagram of a photovoltaic device according to a preferred embodiment of the present invention.

As shown in a back surface side plan view of FIG. 1 and a cross sectional diagram of FIG. 2, a photovoltaic device 100 according to a preferred embodiment of the present invention comprises a substrate 10 comprising a semiconductor material, an i-type amorphous layer 12i, an n-type amorphous layer 12n, a transparent protection layer 14, an i-type amorphous layer 16i, an n-type amorphous layer 16n, an i-type amorphous layer 18i, a p-type amorphous layer 18p, an insulating layer 20, an electrode layer 22, and electrode units 24 (24n and 24p) and 26 (26n and 26p).

FIG. 2 shows a part of a cross section along an X direction in FIG. 1. In addition, in FIG. 1, in order to clearly show regions of the electrode units 2401 (24n and 24p) and 26 (26n and 26p), hatchings of different angles are applied.

The drawings in the present embodiment show the structures schematically, and the sizes and ratios of sizes may differ from those of the actual structures. In addition, the ratios of the sizes or the like may differ among the drawings. In the following description, a side of the photovoltaic device 100 on which the light is incident is described as a light-receiving surface and a side opposite the light-receiving surface is described as a back surface.

With reference to FIGS. 3-7, production steps of the photovoltaic device 100 and the structure of the photovoltaic device 100 will be described.

Figure 3:
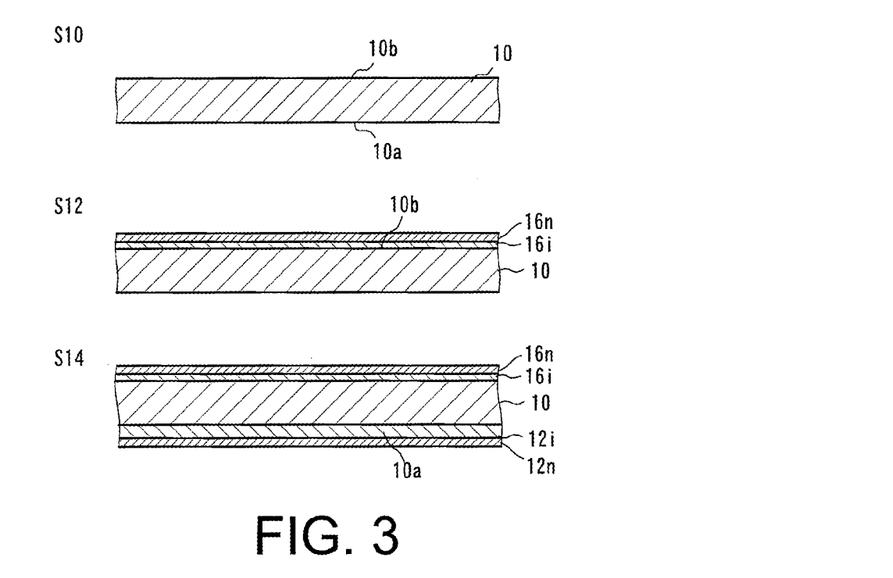
FIG. 3 is a cross sectional diagram showing a production step of a photovoltaic device according to a first preferred embodiment of the present invention.

In step S10, a front surface and the back surface of the substrate 10 comprising the semiconductor material are cleaned. The substrate 10 may be a wafer-shaped substrate comprising crystalline semiconductor of an n-type conductivity or a p-type conductivity. For the substrate 10, for example, semiconductor materials such as monocrystalline silicon, polycrystalline silicon, gallium arsenide (GaAs), indium phosphide (InP), or the like may be employed. The substrate 10 absorbs incident light and generates a carrier pair of an electron and a hole by means of a photovoltaic effect. The substrate 10 has a light-receiving surface 10a and a back surface 10b. In the following description, an example configuration is described in which a wafer-shaped substrate comprising n-type monocrystalline silicon is used as the substrate 10.

The cleaning of the substrate 10 can be executed using a cleaning method such as RCA cleaning. In addition, it is also preferable to form a texture structure in the light-receiving surface 10a of the substrate 10. In this case, the substrate 10 comprising monocrystalline silicon and having a (100) plane is anisotropically etched using an etchant of KOH or an etchant of NaOH, to form a texture structure having a pyramid type, (111) plane. Alternatively, a texture structure having projections and recesses can be formed through etching, using an acidic etchant or an isotropic etching through dry etching, of the light-receiving surface 10a of the substrate 10 comprising polycrystalline silicon or monocrystalline silicon. The back surface 10b of the substrate 10 is preferably a flat surface, and is preferably at least flatter than the light-receiving surface 10a.

In step S12, an i-type amorphous layer 16i and an n-type amorphous layer 16n are formed over the back surface 10b of the substrate 10. The i-type amorphous layer 16i forms a part of the passivation layer covering at least a part of the back surface 10b of the substrate 10.

The i-type amorphous layer 16i is a layer comprising intrinsic amorphous semiconductor. More specifically, the i-type amorphous layer 16i is formed from amorphous silicon containing hydrogen. The i-type amorphous layer 16i is formed to have a lower dopant concentration within the film than those of the n-type amorphous layers 12n and 16n and the p-type amorphous layer 18p. For example, the i-type amorphous layer 16i is preferably formed to have a concentration of the n-type dopant or the p-type dopant of less than or equal to $5 \times 10^{18}/cm^3$.

A thickness of the i-type amorphous layer 16i is preferably set thin enough to inhibit absorption of light as much as possible and thick enough to achieve a sufficient passivation function for the back surface 10b of the substrate 10. For example, the thickness of the i-type amorphous layer 16i is preferably greater than or equal to 0.5 nm and less than or equal to 25 nm.

The n-type amorphous layer 16n is a layer comprising amorphous semiconductor including a dopant of an n-conductive type. Specifically, the n-type amorphous layer 16n is formed from amorphous silicon containing hydrogen. The n-type amorphous layer 16n is formed to have a higher dopant concentration within the film than the i-type amorphous layer 16i. For example, in the n-type amorphous layer 16n, the concentration of the dopant of the n-type is preferably greater than or equal to $1 \times 10^{21}/cm^3$. A thickness of the n-type amorphous layer 16n is preferably set thin enough to inhibit absorption of light as much as possible and thick enough to achieve a sufficiently high open voltage for the photovoltaic device 100. For example, the thickness of the n-type amorphous layer 16n is preferably greater than or equal to 2 nm and less than or equal to 50 nm.

The i-type amorphous layer 16i and the n-type amorphous layer 16n can be formed through CVD such as plasma chemical vapor deposition (PECVD).

Figure 8:
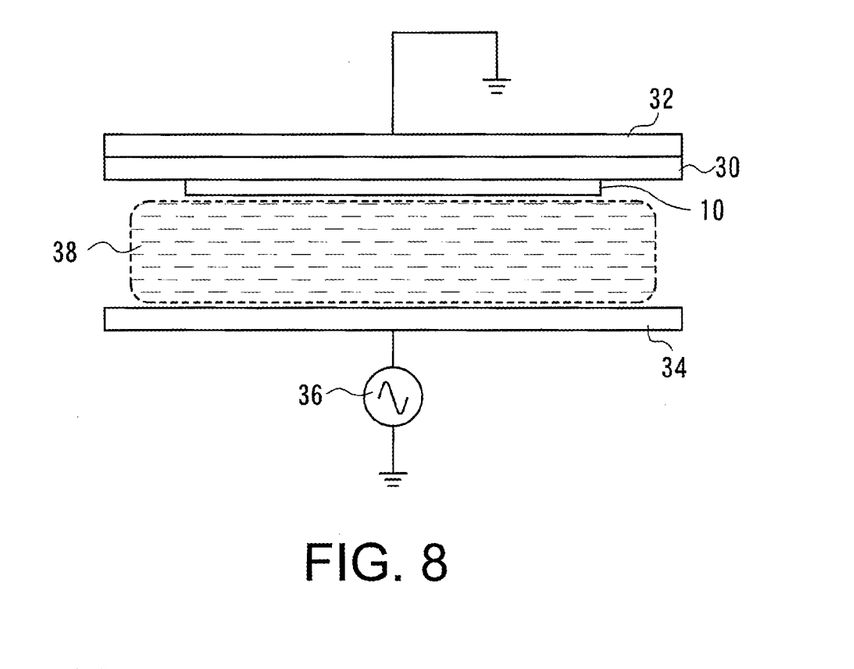
FIG. 8 is a schematic diagram for explaining plasma chemical vapor deposition in the first preferred embodiment of the present invention.

Specifically, as shown in FIG. 8, the i-type amorphous layer 16i can be formed by forming plasma of non-doped material gas, including silicon-containing gas such as silane ($SiH_4$) and not including doping gas of p-type or n-type, by applying high-frequency electric power to one of the electrodes of a parallel-plate electrode, and supplying the plasma to a film formation surface of the substrate 10 which is heated. The substrate 10 is fixed on a substrate holder 30, and is placed on a ground electrode 32. The ground electrode 32 is placed to oppose a high-frequency electrode 34. A high-frequency power supply 36 is connected to the high-frequency electrode 34, and the ground electrode 32 is grounded. In this state, while the material gas including the silicon-containing gas such as silane ($SiH_4$) is supplied, the high-frequency electric power is supplied from the high-frequency power supply 36 to the high-frequency electrode 34 so that plasma 38 of the material gas is generated. The material is supplied from the plasma 38 onto the surface of the substrate 10 and a silicon thin film is formed.

The n-type amorphous layer 16n can be formed by adding an n-type doping gas such as phosphine ($PH_3$) to material gas including silicon-containing gas such as silane ($SiH_4$), forming plasma by applying a high-frequency electric power to an electrode such as a parallel-plate electrode, and supplying the plasma to a film formation surface of the substrate 10 which is heated. In this process, material gas in which the silicon-containing gas is diluted by hydrogen ($H_2$) may be used, to change film characteristics of the i-type amorphous layer 16i and the n-type amorphous layer 16n which are formed according to the dilution percentage.

In the present embodiment, the amorphous layer includes microcrystalline semiconductor. The microcrystalline semiconductor is a film in which crystal grains are precipitated in the amorphous semiconductor. An average grain size of the crystal grains is, although not limited to the following, estimated to be approximately greater than or equal to 1 nm and less than or equal to 80 nm.

In step S14, the i-type amorphous layer 12i and the n-type amorphous layer 12n are formed over the light-receiving surface 10a of the substrate 10. The i-type amorphous layer 12i forms a passivation layer which covers at least a part of the light-receiving surface 10a of the substrate 10. The i-type amorphous semiconductor layer 12i covers at least a power generation region of the substrate 10.

The i-type amorphous layer 12i is a layer comprising intrinsic amorphous semiconductor. More specifically, the i-type amorphous layer 12i is formed from amorphous silicon containing hydrogen. The i-type amorphous layer 12i is formed to have a lower dopant concentration within the film than the n-type amorphous layers 12n and 16n and the p-type amorphous layer 18p. For example, the i-type amorphous layer 12i is preferably formed to have a concentration of the n-type dopant or the p-type dopant of less than or equal to $5 \times 10^{18}/cm^3$.

The i-type amorphous layer 12i is preferably formed thin enough to inhibit absorption of light as much as possible and thick enough to achieve a sufficient passivation function for the light-receiving surface 10a of the substrate 10. For example, the thickness of the i-type amorphous layer 12i is preferably greater than or equal to 1 nm and less than or equal to 50 nm.

The n-type amorphous layer 12n is a layer comprising amorphous semiconductor including a dopant of an n-conductive type. More specifically, the n-type amorphous layer 12n is formed from amorphous silicon containing hydrogen. The n-type amorphous layer 12n is set to have a higher dopant concentration within the film than the i-type amorphous layer 12i. For example, the concentration of the n-type dopant in the n-type amorphous layer 12n is preferably greater than or equal to $1 \times 10^{21}/cm^3$. A thickness of the n-type amorphous layer 12n is preferably set thin enough to inhibit absorption of light as much as possible and thick enough to allow pushing-back of the small-number carriers generated near the light-receiving surface of the photovoltaic device 100 in the direction of the electrode layer 22. For example, the thickness of the n-type amorphous layer 12n is preferably greater than or equal to 2 nm and less than or equal to 50 nm.

The i-type amorphous layer 12i and the n-type amorphous layer 12n can be formed through CVD such as plasma chemical vapor deposition (PECVD). Specifically, similar to the i-type amorphous layer 16i and the n-type amorphous layer 16n, the i-type amorphous layer 12i can be formed by forming plasma of non-doped material gas including silicon-containing gas such as silane ($SiH_4$) by applying high-frequency electric power to an electrode such as a parallel-plate electrode, and supplying the plasma to a film formation surface of the substrate 10 which is heated. The n-type amorphous layer 12n can be formed by adding n-type doping gas such as phosphine ($PH_3$) to material gas including silicon-containing gas such as silane ($SiH_4$), forming plasma by applying high-frequency electric power to an electrode such as a parallel-plate electrode, and supplying the plasma to a film formation surface of the substrate 10 which is heated. In this process, material gas obtained by diluting the silicon-containing gas by hydrogen ($H_2$) may be used so that the film characteristics of the i-type amorphous layer 12i and the n-type amorphous layer 12n which are formed can be changed according to the dilution percentage.

In step S16, the transparent protection layer 14 is formed over the n-type amorphous layer 12n. The transparent protection layer 14 has a function as an antireflection film and a function as a protection film for the light-receiving surface of the photovoltaic device 100. The transparent protection layer 14 may be conductive or may be insulating. The transparent protection layer 14 may be formed, for example, with a transparent insulating material such as silicon oxide, silicon nitride, or silicon oxynitride, or a transparent conductive material such as tin oxide or indium oxide. A thickness of the transparent protection layer 14 is preferably set appropriately such that the antireflection characteristic to be achieved can be realized according to the index of refraction of the material or the like. The thickness of the transparent protection layer 14 is preferably set greater than or equal to 80 nm and less than or equal to 1 μm, for example.

The transparent protection layer 14 can be formed by PVD such as sputtering using a target including the material to be applied, or a method such as chemical vapor deposition (CVD) using gas containing the element of the material to be applied.

The transparent protection layer 14 is preferably made of a material and in a composition such that the transparent protection layer 14 is not etched in the subsequent steps. If the transparent protection layer 14 is etched in the subsequent steps, the transparent protection layer 14 may be again formed over the n-type amorphous layer 12n.

Figure 4:
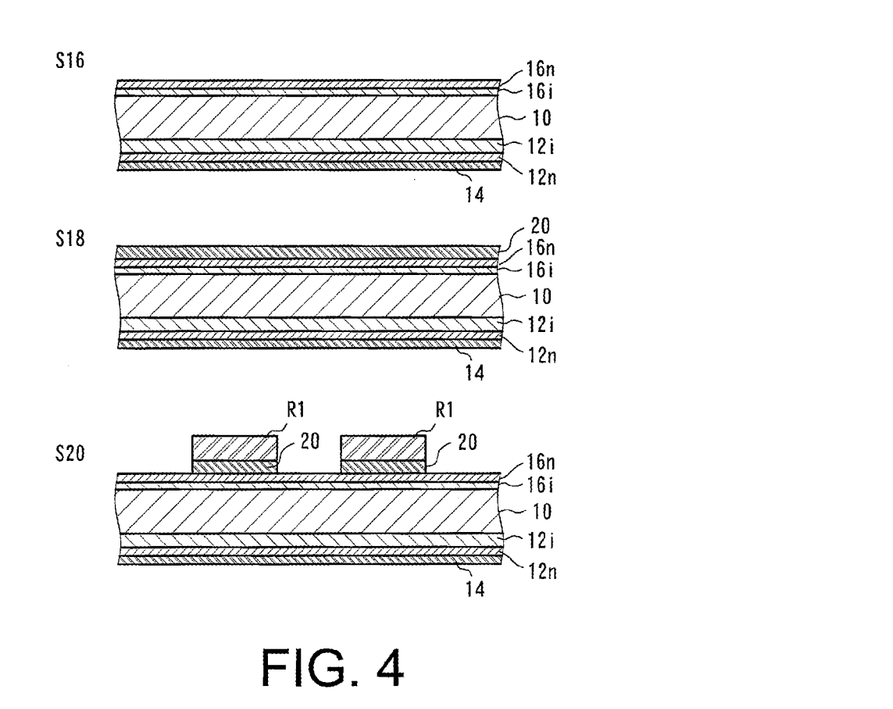
FIG. 4 is a cross sectional diagram showing a production step of a photovoltaic device according to the first preferred embodiment of the present invention.

In step S18, the insulating layer 20 is formed over the n-type amorphous layer 16n. The insulating layer 20 is provided in order to maintain electrical insulation between the i-type amorphous layer 16i and n-type amorphous layer 16n and the i-type amorphous layer 18i an the p-type amorphous layer 18p. The insulating layer 20 may be transparent or non-transparent. The insulating layer 20 may be made of, for example, an insulating material such as silicon oxide, silicon nitride, silicon oxynitride, etc. It is particularly preferable that the insulating layer 20 is made of silicon nitride. In addition, the insulating layer 20 preferably contains hydrogen. A thickness of the insulating layer 20 is preferably greater than or equal to 80 nm and less than or equal to 1 μm, for example.

The insulating layer 20 may be formed through PVD such as sputtering using a target including a material to be applied, and a method such as chemical vapor deposition (CVD) using gas including the element of the material to be applied.

In step S20, the insulating layer 20 is etched. Specifically, etching is applied such that, of the insulating layer 20, a part over the region where the i-type amorphous layer 18i and the p-type amorphous layer 18p are formed is removed. For example, a resist R1 is applied, on a region where the insulating layer 20 is to be left, by a method such as screen printing or an inkjet method, to expose the region in which the insulating layer 20 is to be removed, and the insulating layer 20 in the region where the resist R1 is not applied is etched. The etching may be executed, for example, through wet etching using an etchant. When the insulating layer 20 is made of silicon oxide, silicon nitride, or silicon oxynitride, for example, an etchant of hydrofluoric acid (etchant of HF) can be used as the etchant. After the etching, the resist R1 is removed.

In step S22, the i-type amorphous layer 16i and the n-type amorphous layer 16n are etched. Specifically, etching is applied such that, of the i-type amorphous layer 16i and the n-type amorphous layer 16n, a part over a region in which the i-type amorphous layer 18i and the p-type amorphous layer 18p are formed is removed.

Using the insulating layer 20 as a mask, etching is applied on the i-type amorphous layer 16i and the n-type amorphous layer 16n exposed from the insulating layer 20. The etching may be executed, for example, through wet etching using an etchant. As the etchant, for example, an etchant containing sodium hydroxide (NaOH) may be used. With this process, of the back surface 10b of the substrate 10, a region not covered with the insulating layer 20 is exposed.

Figure 5:
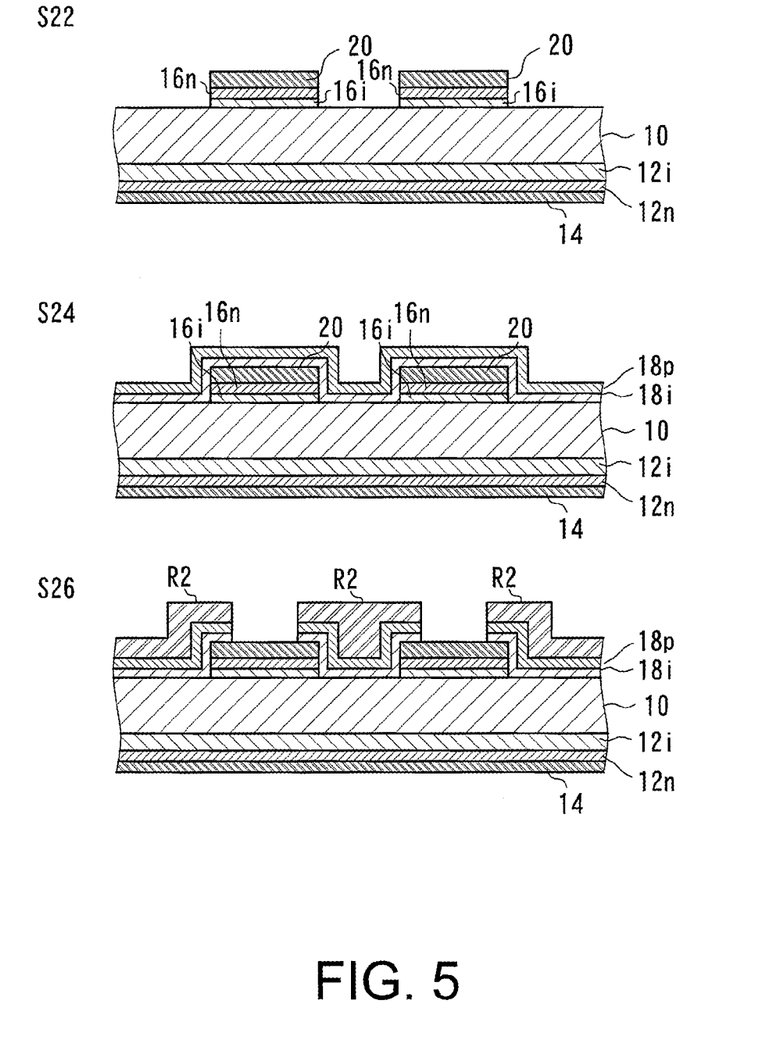
FIG. 5 is a cross sectional diagram showing a production step of a photovoltaic device according to the first preferred embodiment of the present invention.

In step S24, the i-type amorphous layer 18i and the p-type amorphous layer 18p are formed on the side of the back surface 10b of the substrate 10. The i-type amorphous layer 18i forms at least a part of a passivation layer covering at least a part of the back surface 10b of the substrate 10.

The i-type amorphous layer 18i is a layer comprising intrinsic amorphous semiconductor. Specifically, the i-type amorphous layer 18i is formed from amorphous silicon containing hydrogen. The i-type amorphous layer 18i is formed to have a lower dopant concentration within the film than the n-type amorphous layers 12n and 16n and the p-type amorphous layer 18p. For example, the i-type amorphous layer 18i is preferably formed to have a concentration of the n-type dopant or the p-type dopant of less than or equal to $5 \times 10^{18}/cm^3$.

A thickness of the i-type amorphous layer 18i is preferably set thin enough to inhibit absorption of light as much as possible and thick enough to achieve a sufficient passivation function for the back surface 10b of the substrate 10. For example, the thickness of the i-type amorphous layer 18i is preferably greater than or equal to 0.5 nm and less than or equal to 25 nm.

Here, preferably, at least one of the thicknesses of the i-type amorphous layer 16i and the i-type amorphous layer 18i is thinner than the thickness of the i-type amorphous layer 12i. The thicknesses of the i-type amorphous layer 12i, the i-type amorphous layer 16i, and the i-type amorphous layer 18i may be changed, for example, by adjusting the film formation time during the film formation, a substrate temperature during the film formation, concentration of the silicon-containing gas in the material gas and the hydrogen dilution percentage, and the energy supplied for decomposition of the material gas such as the high-frequency electric power supplied to the plasma. In general, if the other conditions are identical, when the film formation time during the film formation is prolonged, the concentration of the silicon-containing gas in the material gas is increased, the hydrogen dilution percentage in the material gas is reduced, or the energy supplied for the material gas decomposition is increased, the thicknesses of the i-type amorphous layer 12i, the i-type amorphous layer 16i, and the i-type amorphous layer 18i tend to be thickened.

The thicknesses of the i-type amorphous layer 12i, the i-type amorphous layer 16i, and the i-type amorphous layer 18i can be determined based on a measurement result of transmission electron microscope observation (TEM) and secondary ion mass spectrometry (SIMS). When there is a distribution in the thickness, an average thickness may be used as an index for comparison.

In addition, preferably, at least one of hydrogen contents in the film of the i-type amorphous layer 16i and the i-type amorphous layer 18i is lower than a hydrogen content of the i-type amorphous layer 12i. The hydrogen contents of the i-type amorphous layer 12i, the i-type amorphous layer 16i, and the i-type amorphous layer 18i can be changed, for example, by adjusting the concentration of the silicon-containing gas in the material gas, the hydrogen dilution percentage, the substrate temperature during the film formation, and the energy supplied for decomposition of the material gas such as the high-frequency electric power supplied to the plasma. In general, if the other conditions are identical, when the substrate temperature during the film formation is increased, the concentration of the silicon-containing gas in the material gas is increased, the hydrogen dilution percentage in the material gas is reduced, or the energy supplied for the material gas decomposition is increased, the hydrogen contents of the i-type amorphous layer 12i, the i-type amorphous layer 16i, and the i-type amorphous layer 18i tend to be reduced.

The hydrogen contents of the i-type amorphous layer 12i, the i-type amorphous layer 16i, and the i-type amorphous layer 18i may be measured through elastic recoil detection analysis (ERDA). When there is a distribution in the hydrogen content in the film, a spatial average may be used as an index for comparison.

The p-type amorphous layer 18p is a layer comprising amorphous semiconductor including a dopant of p-type conductivity. Specifically, the p-type amorphous layer 18p is formed from amorphous silicon containing hydrogen. The p-type amorphous layer 18p is set to have a higher dopant concentration within the film than the i-type amorphous layer 18i. For example, a concentration of the p-type dopant in the p-type amorphous layer 18p is preferably set to be greater than or equal to $1 \times 10^{21}/cm^3$. A thickness of the p-type amorphous layer 18p is preferably set thin enough to inhibit absorption of light as much as possible and thick enough to achieve a sufficiently high open voltage for the photovoltaic device 100. For example, the thickness of the p-type amorphous layer 18p is preferably greater than or equal to 2 nm and less than or equal to 50 nm.

The i-type amorphous layer 18i and the p-type amorphous layer 18p can be formed through CVD such as plasma chemical vapor deposition (PECVD). More specifically, the i-type amorphous layer 18i can be formed by forming plasma of non-doped material gas, including silicon-containing gas such as silane ($SiH_4$) and not including p-type or n-type doping gas, by applying high-frequency electric power to an electrode such as a parallel-plate electrode and supplying the plasma to a film formation surface of the substrate 10 which is heated. The p-type amorphous layer 18p can be formed by adding p-type doping gas such as diborane ($B_2H_6$) to material gas including silicon-containing gas such as silane ($SiH_4$), forming plasma by applying high-frequency electric power to an electrode such as a parallel-plate electrode, and supplying the plasma to a film formation surface of the substrate 10 which is heated. In this case, by using material gas obtained by diluting the silicon-containing gas with hydrogen ($H_2$), it is possible to change the film characteristics of the i-type amorphous layer 18i and the p-type amorphous layer 18p which are formed, according to the dilution percentage.

In step S26, a part of the i-type amorphous layer 18i and the p-type amorphous layer 18p covering the insulating layer 20 is removed.

Specifically, a resist R2 is applied, on a region of the i-type amorphous layer 18i and the p-type amorphous layer 18p to be left, through screen printing or an inkjet method, to expose the region where the i-type amorphous layer 18i and the p-type amorphous layer 18p are to be removed, and the i-type amorphous layer 18i and the p-type amorphous layer 18p are etched using the resist R2 as a mask. The etching may be executed, for example, through wet etching using an etchant. For the etchant, an alkaline etchant may be used. For example, an etchant including sodium hydroxide (NaOH) may be used. After the etching, the resist R2 is removed.

Alternatively, the i-type amorphous layer 18i and the p-type amorphous layer 18p may be etched by applying an etching paste which has a paste-like form or an etching ink having the viscosity adjusted over a region where the i-type amorphous layer 18i and the p-type amorphous layer 18p are to be removed. The etching paste and the etching ink can be applied in a predetermined pattern through screen printing or an inkjet method.

Figure 6:
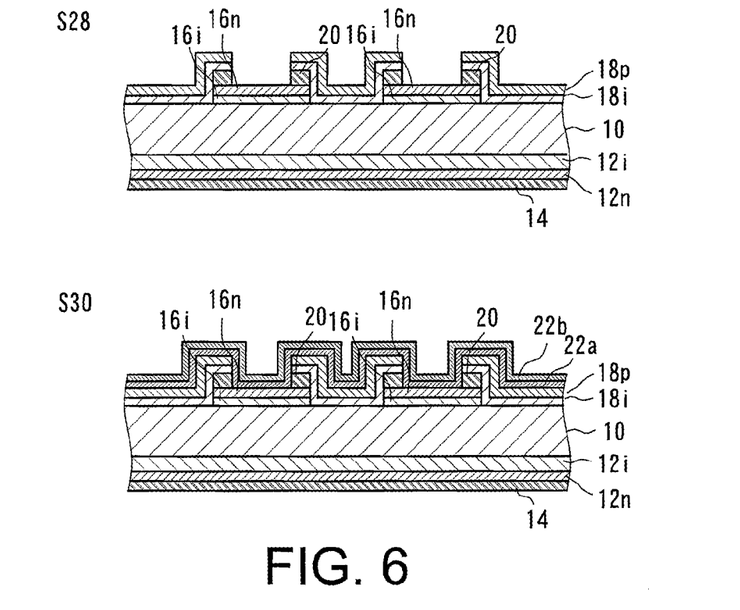
FIG. 6 is a cross sectional diagram showing a production step of a photovoltaic device according to the first preferred embodiment of the present invention.

In step S28, the insulating layer 20 is etched. More specifically, using, as a mask, the i-type amorphous layer 18i and the p-type amorphous layer 18p having a part removed in step S26, the exposed part of the insulating layer 20 is etched and removed using an etchant. Here, an etchant having a higher etching speed with respect to the insulating layer 20 than the etching speed with respect to the p-type amorphous layer 18p is used. For example, for the etchant, an etchant of hydrofluoric acid (HF) or the like may be used. With this process, only the insulating layer 20 exposed from the i-type amorphous layer 18i and the p-type amorphous layer 18p is selectively etched, and the n-type amorphous layer 16n is exposed in this region.

In step S30, the electrode layer 22 is formed over the n-type amorphous layer 16n and the p-type amorphous layer 18p. The electrode layer 22 forms a seed layer for forming the electrode unit 24. The electrode layer 22 preferably has a layered structure of a transparent conductive layer 22a and a conductive layer 22b including a metal. The transparent conductive layer 22a may be formed from a transparent conductive oxide such as indium oxide, tin oxide, titanium oxide, or zinc oxide. The conductive layer 22b may be a metal such as copper (Cu) or an alloy thereof. The transparent conductive layer 22a and the conductive layer 22b can be formed through a thin film formation method such as CVD including plasma chemical vapor deposition (PECVD), sputtering, and PVD including an evaporation method.

Figure 7:
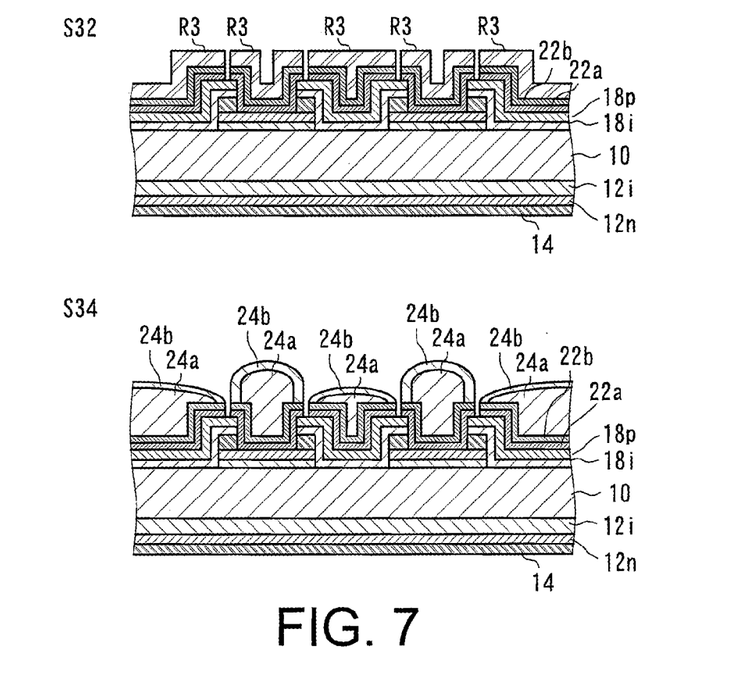
FIG. 7 is a cross sectional diagram showing a production step of a photovoltaic device according to the first preferred embodiment of the present invention.

In step S32, the electrode 22 is partitioned. Of the region in which the electrode layer 22 is formed, a part of the region formed over the insulating layer 20 is removed, to partition the layer into an electrode layer 22 electrically connected to the n-type amorphous layer 16n and an electrode layer 22 electrically connected to the p-type amorphous layer 18p. The partitioning of the electrode layer 22 can be achieved by a patterning technique using a resist R3. For the patterning, etching using ferric chloride ($FeCl_3$) and hydrochloric acid (HCl) may be applied. After the electrode layer 22 is partitioned, the resist R3 is removed.

In step S34, the electrode unit 24 is formed over the region where the electrode layer 22 is left. The electrode unit 24 can be formed by forming a metal layer through electroplating. The electrode unit 24 can be formed, for example, by sequentially layering an electrode unit 24a made of copper (Cu) and an electrode unit 24b made of tin (Sn). The electrode unit 24 is not limited to such a configuration, and may be made of other metals such as gold, silver, or the like, other conductive materials, or a combination thereof. By applying the electroplating while applying a potential on the electrode layer 22, the electrode unit 24 is selectively formed only over the region where the electrode layer 22 is left.

With the partitioning process in step S32, the electrode unit 24n electrically connected to the n-type amorphous layer and the electrode unit 24p electrically connected to the p-type amorphous layer as shown in FIG. 1 are formed. The electrode unit 24n and the electrode unit 24p form finger electrode units. The photovoltaic device 100 is configured such that the electrode unit 24n and the electrode unit 24p forming the finger electrodes extend in the y direction and interdigitate each other in a comb-like shape. In addition, an electrode unit 26n connecting a plurality of the electrode units 24n and an electrode unit 26p connecting a plurality of the electrode units 24p are provided. These electrode units 26n and 26p become bus bar electrodes.

The photovoltaic device 100 in the present embodiment can be formed in a manner described above. In the present embodiment, when the photovoltaic device 100 is formed, the i-type amorphous layer 16i of the back surface is formed before the i-type amorphous layer 12i of the light-receiving surface. As shown in FIG. 6, in the method such as plasma chemical vapor deposition, a surface opposite to the film formation surface may contact the substrate holder 30 or the like during the film formation, possibly resulting in adhesion of impurity or the like or contamination due to formation of an oxide film caused by heating during the film formation. In the present embodiment, the i-type amorphous layer 16i is formed prior to the i-type amorphous layer 12i, so as to prevent the contamination of the interface between the i-type amorphous layer 16i and the substrate 10 and the interface between the i-type amorphous layer 18i which is later formed and the substrate 10, during the film formation of the i-type amorphous layer 12i, and to reduce a contact resistance between the semiconductor substrate 10 and the i-type amorphous layer 16i and between the semiconductor substrate 10 and the i-type amorphous layer 18i.

In addition, the thicknesses of the i-type amorphous layer 16i and the i-type amorphous layer 18i are set to be thinner than that of the i-type amorphous layer 12i, so that electrical resistances per unit area of the i-type amorphous layer 16i and the i-type amorphous layer 18i can be set lower than that of the i-type amorphous layer 12i. With such a configuration, the resistances in the thickness direction of the i-type amorphous layer 16i and the i-type amorphous layer 18i can be reduced.

Because the resistivity tends to be reduced when the hydrogen content is reduced, the hydrogen contents in the film of the i-type amorphous layer 16i and the i-type amorphous layer 18i are set lower than that of the i-type amorphous layer 12i, so that the electrical resistances per unit area of the i-type amorphous layer 16i and the i-type amorphous layer 18i can be set lower than that of the i-type amorphous layer 12i. With such a configuration, the resistances in the thickness direction of the i-type amorphous layer 16i and the i-type amorphous layer 18i can be reduced.

In the back contact type photovoltaic device, the i-type amorphous layer 16i and the i-type amorphous layer 18i on the back surface side become paths of the carriers and the i-type amorphous layer 12i does not become a path of the carriers. Therefore, by reducing the resistances in the thickness direction of the i-type amorphous layer 16i and the i-type amorphous layer 18i, a collection efficiency of the carriers can be improved.

On the other hand, the characteristic of the i-type amorphous layer 12i does not need to be changed from those of the related art, and the light absorption or the like on the light-receiving surface side is not changed. Therefore, the power generation efficiency of the photovoltaic device can be improved.

Second Preferred Embodiment

Figure 9:
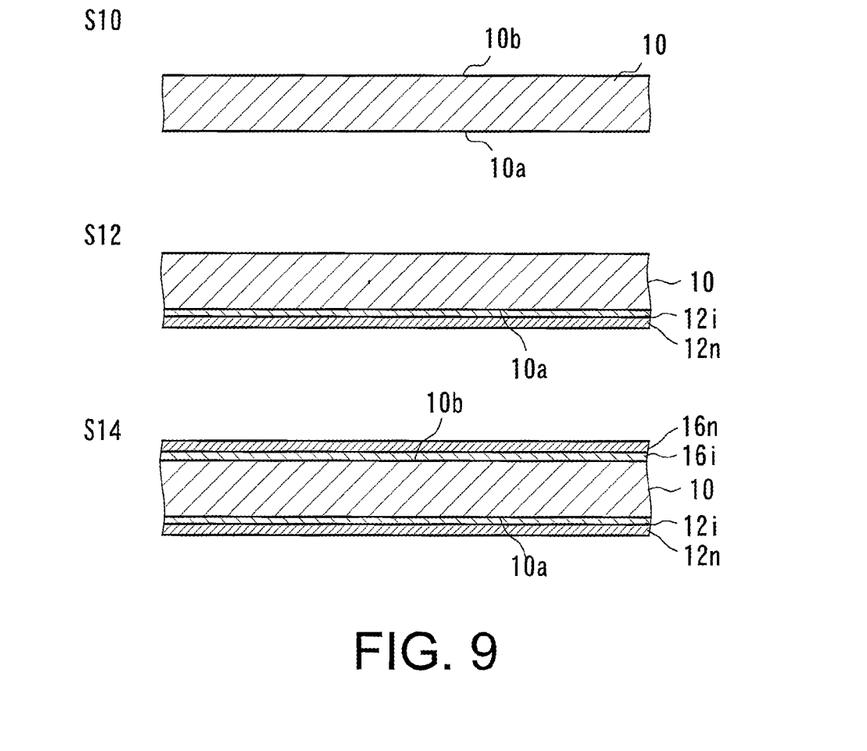
FIG. 9 is a cross sectional diagram showing a production step of a photovoltaic device according to the first preferred embodiment of the present invention.

In the first preferred embodiment, the i-type amorphous layer 16i and the n-type amorphous layer 16n are formed before the i-type amorphous layer 12i and the n-type amorphous layer 12n. Alternatively, these layers may be formed in reverse order. More specifically, as shown in FIG. 9, a configuration may be employed in which, in step S12, the i-type amorphous layer 12i and the n-type amorphous layer 12n are formed, and, in step S14, the i-type amorphous layer 16i and the n-type amorphous layer 16n are formed. Here, the structure and the production method for which no particular explanation is given are similar to those of the first preferred embodiment.

In this process, the i-type amorphous layer 12i is preferably formed thin enough to inhibit absorption of light as much as possible and thick enough to achieve a sufficient passivation function for the light-receiving surface 10a of the substrate 10. For example, the thickness of the i-type amorphous layer 12i is preferably greater than equal to 0.5 nm and less than or equal to 25 nm.

A thickness of the n-type amorphous layer 12n is preferably set thin enough to inhibit absorption of light as much as possible and thick enough to allow pushing-back of the small-number carriers generated near the light-receiving surface of the photovoltaic device 100 in the direction of the electrode layer 22. For example, the thickness of the n-type amorphous layer 12n is preferably greater than or equal to 1 nm and less than or equal to 50 nm.

Similarly, a thickness of the i-type amorphous layer 16i is preferably set thin enough to inhibit absorption of light as much as possible and thick enough to achieve a sufficient passivation function for the back surface 10b of the substrate 10. For example, the thickness of the i-type amorphous layer 16i is greater than or equal to 1 nm and less than or equal to 50 nm.

A thickness of the n-type amorphous layer 16n is preferably set thin enough to inhibit absorption of light as much as possible and thick enough to achieve a sufficiently high open voltage for the photovoltaic device 100. For example, the thickness of the n-type amorphous layer 16n is preferably greater than or equal to 1 nm and less than or equal to 50 nm.

A thickness of the i-type amorphous layer 18i is preferably set thin enough to inhibit absorption of light as much as possible and thick enough to achieve a sufficient passivation function for the back surface 10b of the substrate 10. For example, the thickness of the i-type amorphous layer 18i is preferably greater than or equal to 1 nm and less than or equal to 25 nm.

A thickness of the p-type amorphous layer 18p is preferably set thin enough to inhibit absorption of light as much as possible and thick enough to achieve a sufficiently high open voltage for the photovoltaic device 100. For example, the thickness of the p-type amorphous layer 18p is preferably greater than or equal to 1 nm and less than or equal to 50 nm.

Here, the thickness of the i-type amorphous layer 12i is preferably set thinner than the thicknesses of the i-type amorphous layer 16i and the i-type amorphous layer 18i.

In addition, the hydrogen content of the i-type amorphous layer 12i is preferably set higher than the hydrogen contents in the film of the i-type amorphous layer 16i and the i-type amorphous layer 18i.

The photovoltaic device 100 of the present embodiment can be formed in a manner described above. In the present embodiment, when the photovoltaic device 100 is formed, the i-type amorphous layer 12i on the light-receiving surface is formed before the i-type amorphous layer 16i of the back surface. In CVD such as plasma chemical vapor deposition, a surface opposite the film formation surface may contact the substrate holder 30 or the like during the film formation, possibly resulting in adhesion of impurity or the like or contamination due to formation of an oxide film caused by heating during the film formation. In the present embodiment, by forming the i-type amorphous layer 12i before the i-type amorphous layer 16i, it is possible to prevent contamination of the interface between the i-type amorphous layer 12i and the substrate 10 when the i-type amorphous layer 16i and the i-type amorphous layer 18i are formed. A region near the interface between the substrate 10 and the i-type amorphous layer 12i is a region where the amount of absorption of the light is the greatest, and, consequently, the amount of generation of the carriers is the greatest. Therefore, because the contamination at the interface between the substrate 10 and the i-type amorphous layer 12i can be reduced, recombination of the carriers can be inhibited and the photovoltaic efficiency can be improved.

In addition, by setting the thickness of the i-type amorphous layer 12i to be thinner than those of the i-type amorphous layer 16i and the i-type amorphous layer 18i, the amount of absorption of light at the i-type amorphous layer 12i can be set to be lower than those of the i-type amorphous layer 16i and the i-type amorphous layer 18i. With such a configuration, the amount of light reaching from the light-receiving surface 10a to the inside of the substrate 10 can be increased, and the photovoltaic efficiency can be improved.

Because the absorption of light tends to reduce with an increase in the hydrogen content, the hydrogen content in the film of the i-type amorphous layer 12i may be set higher than those of the i-type amorphous layer 16i and the i-type amorphous layer 18i, so that the amount of absorption of light in the i-type amorphous layer 12i is smaller than those of the i-type amorphous layer 16i and the i-type amorphous layer 18i. With such a configuration, the amount of light reaching from the light-receiving surface 10a to the inside of the substrate 10 can be increased and the photovoltaic efficiency can be improved.

In the above description, the polarities of the dopants for the substrate 10, the n-type amorphous layer 12n, the n-type amorphous layer 16n, and the p-type amorphous layer 18p may be suitably exchanged.

In addition, in the above description, the i-type amorphous layer 12i formed over the light-receiving surface 10a of the substrate 10 is preferably formed over the entire surface of the light-receiving surface 10a, but alternatively, the i-type amorphous layer 12i may be formed in regions other than a part of a peripheral section of the light-receiving surface 10a.

EXPLANATION OF REFERENCE NUMERALS

10 SUBSTRATE; 10a LIGHT-RECEIVING SURFACE; 10b BACK SURFACE; 12i i-TYPE AMORPHOUS LAYER; 12n n-TYPE AMORPHOUS LAYER; 14 TRANSPARENT PROTECTION LAYER; 16i i-TYPE AMORPHOUS LAYER; 16n n-TYPE AMORPHOUS LAYER; 18i i-TYPE AMORPHOUS LAYER; 18p p-TYPE AMORPHOUS LAYER; 20 INSULATING LAYER; 22 ELECTRODE LAYER; 22a TRANSPARENT CONDUCTIVE FILM; 22b CONDUCTIVE LAYER; 24 ELECTRODE UNIT; 24a ELECTRODE UNIT; 24b ELECTRODE UNIT; 24n FINGER ELECTRODE UNIT; 24p FINGER ELECTRODE UNIT; 26n BUS BAR ELECTRODE UNIT; 26p BUS BAR ELECTRODE UNIT; 30 SUBSTRATE HOLDER; 32 HIGH-FREQUENCY ELECTRODE; 34 GROUND ELECTRODE; 36 HIGH-FREQUENCY POWER SUPPLY; 38 PLASMA; 100 PHOTOVOLTAIC DEVICE

The invention claimed is:

1. A method of producing a photovoltaic device comprising:
   a first step comprising forming a first passivation layer in contact with a substrate over a region of at least a part of a first surface of the substrate comprising a semiconductor material;

a second step comprising forming, with the first surface being covered by the first passivation layer after the first step, a second passivation layer and a third passivation layer, both in contact with the substrate over a region of at least a part of a second surface of the semiconductor substrate opposite the first surface; and a third step comprising forming after the second step, an electrode only on the second surface side wherein the second step further comprises:

forming the second passivation layer on the second surface, with the first surface of the substrate being covered by the first passivation layer;

forming a first semiconductor layer and an insulating layer on the second passivation layer on the second surface, with the first surface of the substrate being covered by the first passivation layer, the first semiconductor layer comprising a dopant of a first conductive type;

exposing a part of a back surface of the substrate by etching a part of the first semiconductor layer and a part of the insulating layer, with the first surface of the substrate being covered by the first passivation layer;

forming the third passivation layer on an exposed area of the back surface of the substrate, with the first surface of the substrate being covered by the first passivation layer; and forming a second semiconductor layer on the third passivation layer, with the first surface of the substrate being covered by the first passivation layer, the second semiconductor layer comprising a dopant of a second conductive type different from the first conductive type, and the first passivation layer, the second passivation layer, and the third passivation layer are formed such that:

a thickness of the second passivation layer is thinner than a thickness of the first passivation layer;

a hydrogen content of the second passivation layer is lower than a hydrogen content of the first passivation layer; and an amount of absorption of light of the first passivation layer is lower than an amount of absorption of light of the second passivation layer.

2. The method of producing the photovoltaic device according to claim 1, wherein the first passivation layer and the second passivation layer are amorphous silicon layers.

* * * * *